US011322207B1

(12) United States Patent
Cheng et al.

(10) Patent No.: US 11,322,207 B1
(45) Date of Patent: May 3, 2022

(54) PROGRAM METHOD INCLUDING MULTIPLE PRECHARGE STEPS FOR MEMORY DEVICE

(71) Applicant: MACRONIX INTERNATIONAL CO., LTD., Hsinchu (TW)

(72) Inventors: Cheng-Hsien Cheng, Yunlin County (TW); Yu-Hung Huang, Tainan (TW); Chia-Hong Lee, Taoyuan (TW); Yin-Jen Chen, Zhubei (TW)

(73) Assignee: MACRONIX INTERNATIONAL CO., LTD., Hsinchu (TW)

( * ) Notice: Subject to any disclaimer, the term of this patent is extended or adjusted under 35 U.S.C. 154(b) by 0 days.

(21) Appl. No.: 17/137,461

(22) Filed: Dec. 30, 2020

(51) Int. Cl.
*G11C 16/04* (2006.01)
*G11C 16/10* (2006.01)
*G11C 16/34* (2006.01)
*G11C 16/24* (2006.01)

(52) U.S. Cl.
CPC .......... *G11C 16/10* (2013.01); *G11C 16/0483* (2013.01); *G11C 16/24* (2013.01); *G11C 16/3459* (2013.01)

(58) Field of Classification Search
CPC ..... G11C 16/10; G11C 16/0483; G11C 16/24; G11C 16/3459
USPC .................................................. 365/185.17
See application file for complete search history.

(56) References Cited

U.S. PATENT DOCUMENTS

| | | | |
|---|---|---|---|
| 7,145,806 B2 * | 12/2006 | Kawai | G11C 16/12 365/185.25 |
| 7,463,531 B2 | 12/2008 | Hemink et al. | |
| 7,911,849 B2 | 3/2011 | Hemink | |
| 8,174,902 B2 * | 5/2012 | Lee | G11C 16/0483 365/185.25 |
| 8,305,816 B2 * | 11/2012 | Park | G11C 11/5628 365/185.25 |
| 8,482,983 B2 * | 7/2013 | Honma | G11C 16/10 365/185.24 |
| 9,361,998 B2 * | 6/2016 | Maejima | G11C 16/08 |
| 2015/0262679 A1 * | 9/2015 | Shimura | G11C 16/0408 365/185.22 |

OTHER PUBLICATIONS

TW Office Action dated Apr. 26, 2021 in Taiwan application (No. 109146866).

\* cited by examiner

*Primary Examiner* — Tha-O H Bui

(74) *Attorney, Agent, or Firm* — McClure, Qualey & Rodack, LLP

(57) ABSTRACT

A program method for a memory device is provided. The memory device includes a plurality of memory cells, a bit line and word lines electrically connected to the plurality of memory cells. The plurality of memory cells includes a selected memory cell and unselected memory cells when the memory device is in a program operation. The program method including performing precharge steps, performing program steps and performing a verification step to the selected memory cell after the precharge steps and the program steps. Each of the precharge steps includes applying a precharge voltage to the bit line electrically connected to the unselected memory cells. Each of the program steps includes applying a program voltage to a word line of the word lines electrically connected to the selected memory cell.

20 Claims, 6 Drawing Sheets

PROGRAM METHOD INCLUDING MULTIPLE PRECHARGE STEPS FOR MEMORY DEVICE

BACKGROUND

Technical Field

The disclosure relates to a program method for a memory device, and more particularly to a program method for a 3-dimentional memory device.

Description of the Related Art

As critical dimensions of devices in integrated circuits shrink toward perceived limits of manufacturing technologies, designers have been looking to techniques to achieve greater storage capacity, and to achieve lower costs per bit. However, as a size and a pitch for memory cells shrink with a technical trend, program disturbance during a program operation of the memory cells has become increasingly serious.

It is important to provide technology for programming a memory device with reduced program disturbance.

SUMMARY

The present disclosure relates to a program method for a memory device.

According to an embodiment of the present disclosure, a program method for a memory device is provided. The memory device includes a plurality of memory cells, a bit line and word lines electrically connected to the plurality of memory cells. The plurality of memory cells includes a selected memory cell and unselected memory cells when the memory device is in a program operation. The program method includes performing precharge steps, performing program steps and performing a verification step to the selected memory cell after the precharge steps and the program steps. Each of the precharge steps includes applying a precharge voltage to the bit line electrically connected to the unselected memory cells. Each of the program steps includes applying a program voltage to a word line of the word lines electrically connected to the selected memory cell.

According to another embodiment of the present disclosure, a program method for a memory device is provided. The memory device includes a plurality of memory cells, a bit line and word lines electrically connected to the plurality of memory cells. The plurality of memory cells includes a selected memory cell and unselected memory cells when the memory device is in a program operation. The program method includes performing a first precharge step, performing a first program step, performing second precharge steps, and performing second program steps. The first precharge step includes applying a precharge voltage to the bit line electrically connected to the unselected memory cells. The first program step includes applying a first program voltage to a word line of the word lines electrically connected to the selected memory cell. Each of the second precharge steps includes applying the precharge voltage to the bit line electrically connected to the unselected memory cells. Each of the second program steps includes applying a second program voltage to the word line of the word lines electrically connected to the selected memory cell. The second program voltage is different from the first program voltage.

The above and other embodiments of the disclosure will become better understood with regard to the following detailed description of the non-limiting embodiment(s). The following description is made with reference to the accompanying drawings.

DETAILED DESCRIPTION

Embodiments disclosed herein relate to program methods for memory devices, which can reduce program disturbance for a memory device. The program method can be used in a 3-dimentional memory device, such as a 3-dimentional NAND flash memory.

The illustrations may not be necessarily drawn to scale, and there may be other embodiments of the present disclosure which are not specifically illustrated. Thus, the specification and the drawings are to be regard as an illustrative sense rather than a restrictive sense. Moreover, the descriptions disclosed in the embodiments of the disclosure such as detailed construction, manufacturing steps and material selections are for illustration only, not for limiting the scope of protection of the disclosure. The steps and elements in details of the embodiments could be modified or changed according to the actual needs of the practical applications. The disclosure is not limited to the descriptions of the embodiments. The illustration uses the same/similar symbols to indicate the same/similar elements.

Moreover, use of ordinal terms such as "first", "second", "third", etc., in the specification and claims to modify an element or a step does not by itself connote any priority, precedence, or order of one claim element or step over another, but are used merely as labels to distinguish one claim element or step having a certain name from another element or step having the same name (but for use of the ordinal term) to distinguish the claim elements or steps.

Use of term "electrically connected" in the specification and claims may mean that elements form an ohmic contact, a connection between elements allows an electric current flowing through the elements, or an element operationally relates to another element. The term "operationally relates to" may mean that an element is configured to drive another element without an electric current flowing therebetween. The present disclosure is not limited thereto. For instance, a bit line electrically connected to the memory cells may be understood as a bit line configured to drive the memory cells, that is, values of electric fields applied to the memory cells may be changed as a value of a voltage applied to the bit line electrically connected to the memory cells is changed. A word lines electrically connected to the memory cell may be understood a word line configured to drive the memory cell, that is, a value of electric field applied to the memory cell may be changed as a value of a voltage applied to the word line electrically connected to the memory cell is changed.

The memory device suitable for performing a program method of the present disclosure may include memory strings, bit lines, string selection lines, word lines, ground selection lines, and common source lines. For illustration purposes, two memory strings are illustrated in FIG. 1 as an example.

Figure 1:
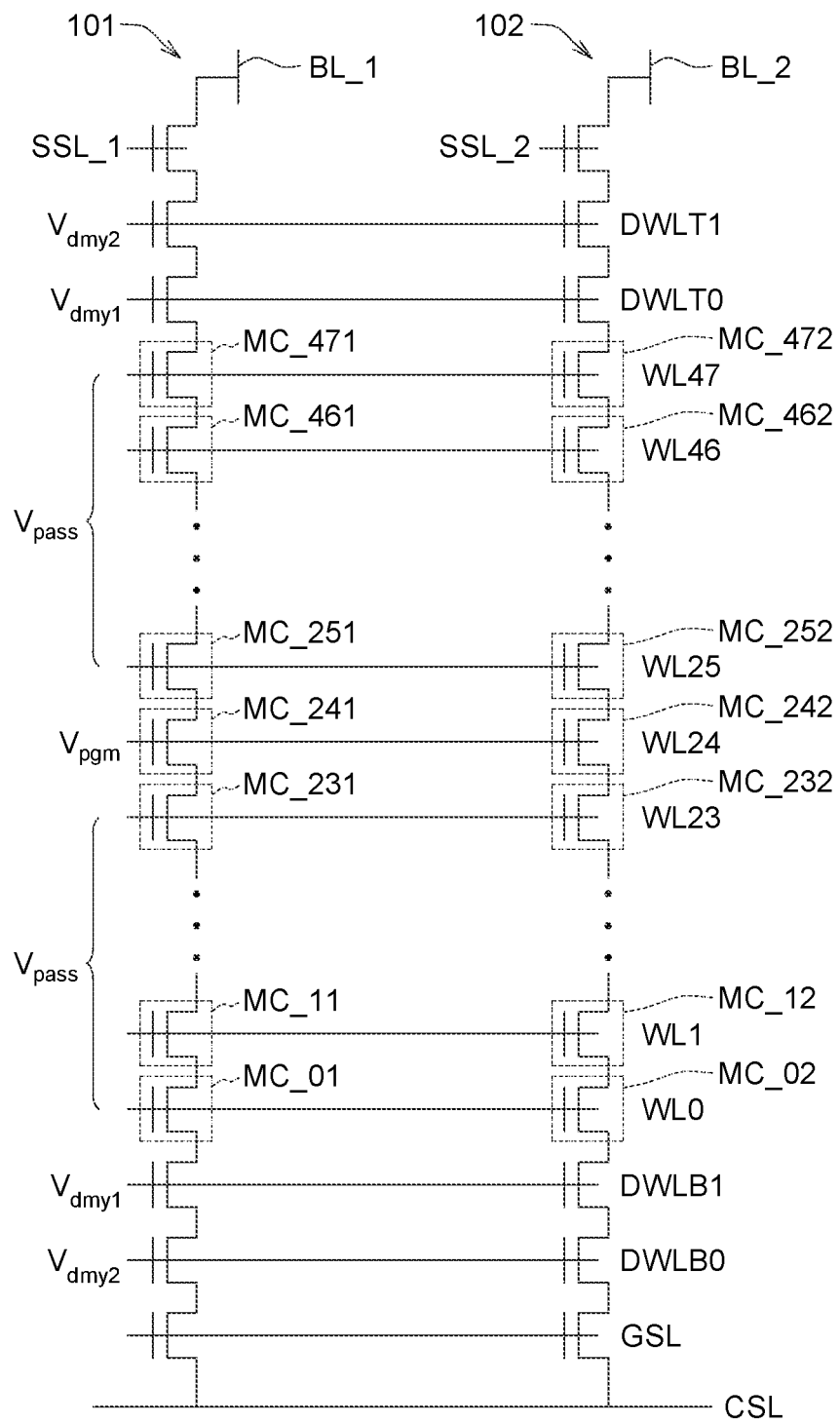
FIG. 1 illustrates a memory device.

FIG. 1 illustrates a memory device. The memory device includes a first memory string 101, a second memory string 102, bit lines BL, string selection lines SSL, word lines WL, a ground selection line GSL, and a common source line CSL. The first memory string 101 is different from and adjacent to the second memory string 102.

The first memory string 101 includes a plurality of memory cells MC (MC_01, MC_11 . . . MC_231, MC_241, MC_251 . . . MC_461, MC_471) electrically connected to each other with a series electrical connection. The second memory string 102 includes a plurality of memory cells MC (MC_02, MC_12 . . . MC_232, MC_242, MC_252 . . . MC_462, MC_472) electrically connected to each other with a series electrical connection. The word lines WL includes a word line WL0 electrically connected to the memory cell MC_01 and the memory cell MC_02 disposed at a lower end of the first memory string 101 and the second memory string 102 respectively, a word line WL47 electrically connected to the memory cell MC_471 and the memory cell MC_472 disposed at an upper end of the first memory string 101 and the second memory string 102 respectively, and word lines WL1-WL46 arranged in order between the word line WL0 and the word line WL47. Each of the word lines WL1-WL46 is electrically connected to each of the memory cells MC_11 . . . MC_231, MC_241, MC_251 . . . MC_461 of the first memory string 101 respectively. Each of the word lines WL1-WL46 is electrically connected to each of the memory cells MC_12 . . . MC_232, MC_242, MC_252 . . . MC_462 of the second memory string 102 respectively.

The first memory string 101 is electrically connected between a bit line BL_1 and a common source line CSL. The second memory string 102 is electrically connected between a bit line BL_2 and a common source line CSL. Specifically, a channel line of the first memory string 101 is electrically connected between the bit line BL_1 and the common source line CSL, and a channel line of the second memory string 102 is electrically connected between the bit line BL_2 and the common source line CSL. In an embodiment, the first memory string 101 and the second memory string 102 may be electrically connected to the same bit line. A string selection line SSL_1 and a ground selection line GSL are electrically connected to the opposite ends of the first memory string 101. A string selection line SSL_2 and the ground selection line GSL are electrically connected to the opposite ends of the second memory string 102. Specifically, the string selection line SSL_1 is electrically connected between the bit line BL_1 and the memory cell MC_471 of the first memory string 101; the string selection line SSL_2 is electrically connected between the bit line BL_2 and the memory cell MC_472 of the second memory string 102; the ground selection line GSL are electrically connected between the common source line CSL and the memory cell MC_01 of the first memory string 101 and between the common source line CSL and the memory cell MC_02 of the second memory string 102. In an embodiment, the memory device may include more string selection lines SSL electrically connected between the bit line BL_1 and the memory cell MC_471 and/or between the bit line BL_2 and the memory cell MC_472. The memory device may further includes dummy word lines DWLT0, DWLT1 disposed between the word line WL47 and the bit lines BL, and dummy word lines DWLB0, DWLB1 disposed between the word line WL0 and the common source line CSL.

When the memory device shown in FIG. 1 is in a program operation, one of the memory cells MC is selected for programming, and the other memory cells MC can be understood as unselected memory cells. For example, the memory cell MC_241 is selected and can be understood as a selected memory cell, the other memory cells MC (i.e. memory cells MC_01, MC_11 . . . MC_231, MC_251 . . . MC_461, MC_471 and MC_02, MC_12 . . . MC_232, MC_242, MC_252 . . . MC_462, MC_472) can be understood as unselected memory cells, the first memory string 101 including the selected memory cell (MC_241) can be understood as a selected memory string, and the second memory string 102 including the unselected memory cells (MC_02, MC_12 . . . MC_232, MC_242, MC_252 . . . MC_462, MC_472) can be understood as an unselected memory string.

In the program operation, the program method of the present disclosure includes performing more than one precharge step to the unselected memory cells (MC_02, MC_12 . . . MC_232, MC_242, MC_252 . . . MC_462, MC_472) of the second memory string 102 so as to turn off the unselected memory cells (MC_02, MC_12 . . . MC_232, MC_242, MC_252 . . . MC_462, MC_472) of the second memory string 102 and inhibit programming of the unselected memory cells (MC_02, MC_12 . . . MC_232, MC_242, MC_252 . . . MC_462, MC_472) of the second memory string 102. In the program operation, the program method further includes performing more than one program steps to the selected memory cell (MC_241) of the first memory string 101 so as to program the selected memory cell (MC_241). Each of the precharge steps to the unselected memory cells is performed prior to each of the program steps to the selected memory cell. In the program operation, the program method further includes performing a verification step to the selected memory cell (MC_241) after the precharge steps and the program steps so as to verify whether the selected memory cell (MC_241) is programmed properly.

Figure 2A:
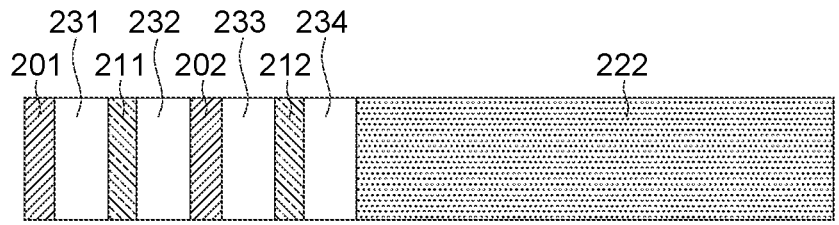
FIG. 2A illustrates a program method for the memory device according to an embodiment.
Figure 2B:
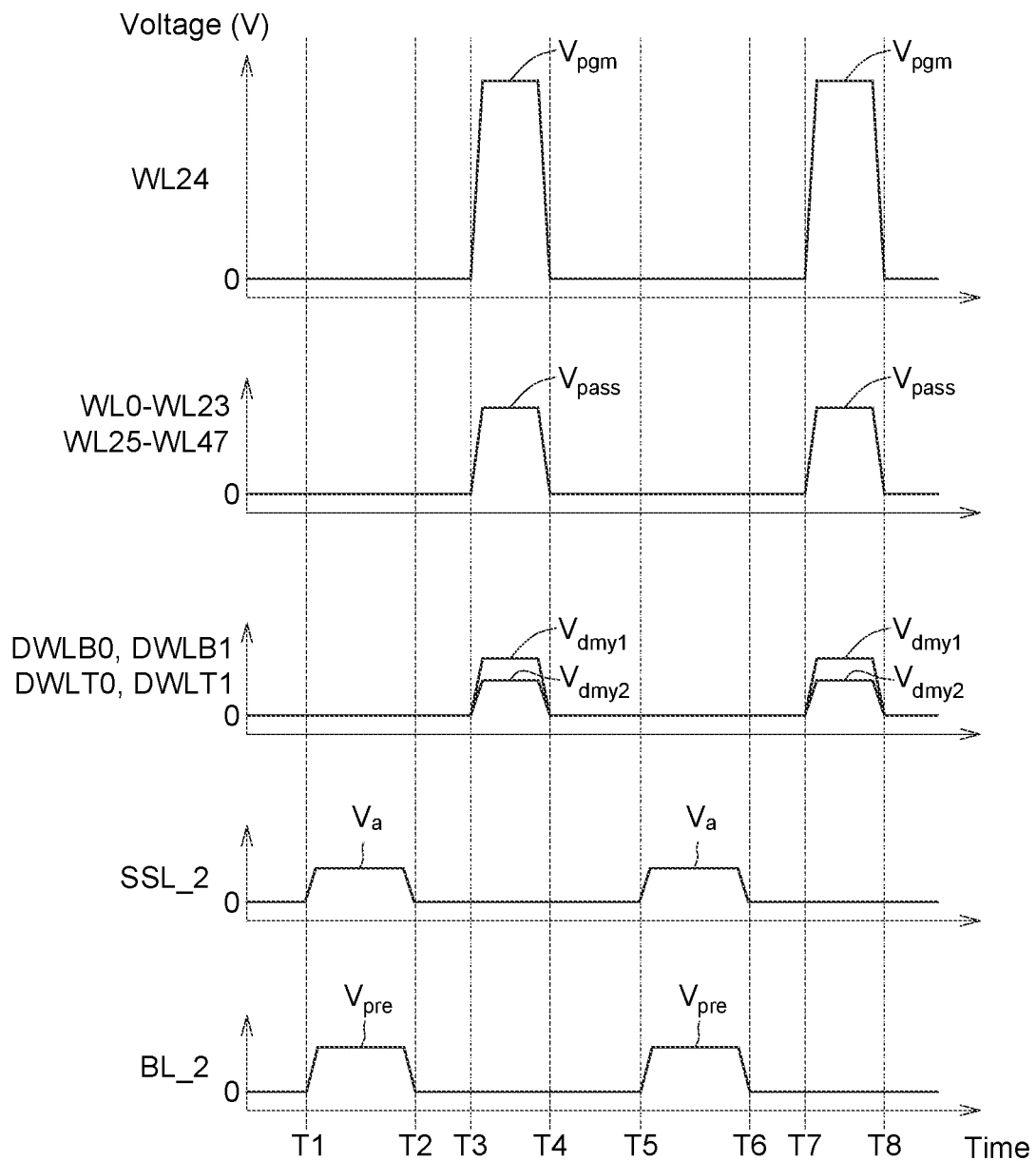
FIG. 2B illustrates a voltage sequence diagram of the program method for the memory device according to an embodiment.

Please refer to FIG. 1 and FIGS. 2A-2B at the same time. FIG. 2A illustrates a program method for the memory device according to an embodiment. FIG. 2B illustrates a voltage (bias) sequence diagram of the program method for the memory device shown in FIG. 2A. A vertical axis in FIG. 2B represents voltages (or biases) provided to the word line WL24 electrically connected to the selected memory cell (MC_241), the word lines WL0-WL23, WL25-WL47 electrically connected to the unselected memory cells (MC_01, MC_11 . . . MC_231, MC_251 . . . MC_461, MC_471 and MC_02, MC_12 . . . MC_232, MC_252 . . . MC_462, MC_472), the dummy word lines DWLT0, DWLT1, DWLB0, DWLB1, the string selection line SSL_2 electrically connected to the unselected memory cells in the second memory string 102, and the bit line BL_2. A horizontal axis in FIG. 2B represents a time, including a time point T1, a time point T2 . . . a time point T8 in a sequent order.

The program method for the memory device includes performing precharge steps 201, 202, performing program steps 211, 212, and performing a verification step 222 after the precharge steps 201, 202 and the program steps 211, 212 in the program operation. The program method may further include a processing step 231 performed between the precharge step 201 and the program step 211, a processing step 232 performed between the program step 211 and the precharge step 202, a processing step 233 performed between the precharge step 202 and the program step 212, and a processing step 234 performed between the program step 212 and the verification step 222 in the program operation. Specifically, the precharge step 201, the processing step 231, the program step 211, the processing step 232, the precharge step 202, the processing step 233, the program step 212, the processing step 234, and the verification step 222 may be performed in sequence.

For example, the precharge step 201 may include applying a precharge voltage $V_{pre}$ to the bit line BL_2 electrically connected to the unselected memory cells (MC_02, MC_12 . . . MC_232, MC_242, MC_252 . . . MC_462, MC_472) of the second memory string 102 from the time point T1 to the time point T2 (first precharge duration) so as to increase a channel potential of the second memory string 102, and applying a pulse voltage $V_a$ to the string selection line SSL_2 from the time point T1 to the time point T2 so as to connect the second memory string 102 with the bit line BL_2. In the precharge step 201, the word lines WL0-WL47 and the dummy word lines DWLT0, DWLT1, DWLB0, DWLB1 may be 0 volts (V). The program step 211 may include applying a program voltage $V_{pgm}$ to the word line WL24 electrically connected to the selected memory cell (MC_241) from the time point T3 to the time point T4 (first program duration) so as to program the selected memory cell (MC_241), and applying a pass voltage $V_{pass}$ to the word lines WL0-WL23, WL25-WL47 from the time point T3 to the time point T4. In an embodiment, the pass voltage $V_{pass}$ is less than the program voltage $V_{pgm}$. In the program step 211, a dummy voltage $V_{dmy1}$ is applied to the dummy word lines DWLT0, DWLB1, and a dummy voltage $V_{dmy2}$ is applied to the dummy word lines DWLT1, DWLB0. In the program step 211, the string selection line SSL_2 and the bit line BL_2 may be 0V.

The precharge step 202 may include applying the precharge voltage $V_{pre}$ to the bit line BL_2 electrically connected to the unselected memory cells (MC_02, MC_12 . . . MC_232, MC_242, MC_252 . . . MC_462, MC_472) of the second memory string 102 from the time point T5 to the time point T6 (second precharge duration) so as to increase the channel potential of the second memory string 102, and applying the pulse voltage $V_a$ to the string selection line SSL_2 from the time point T5 to the time point T6 so as to connect the second memory string 102 with the bit line BL_2. In the precharge step 202, the word lines WL0-WL47 and the dummy word lines DWLT0, DWLT1, DWLB0, DWLB1 may be 0V. The program step 212 may include applying the program voltage $V_{pgm}$ to the word line WL24 electrically connected to the selected memory cell (MC_241) from the time point T7 to the time point T8 (second program duration) so as to program the selected memory cell (MC_241), and applying the pass voltage $V_{pass}$ to the word lines WL0-WL23, WL25-WL47 from the time point T7 to the time point T8. In the program step 212, a dummy voltage $V_{dmy1}$ is applied to the dummy word lines DWLT0, DWLB1, and a dummy voltage $V_{dmy2}$ is applied to the dummy word lines DWLT1, DWLB0. In the program step 212, the string selection line SSL_2 and the bit line BL_2 may be 0V. The dummy voltage $V_{dmy1}$ may be larger than the dummy voltage $V_{dmy2}$. The values of the dummy voltage $V_{dmy1}$ and the dummy voltage $V_{dmy2}$ may be between the values of the pulse voltage $V_a$ and the pass voltage $V_{pass}$.

The processing step 231 may be performed from the time point T2 to the time point T3. The processing step 232 may be performed from the time point T4 to the time point T5. The processing step 233 may be performed from the time point T6 to the time point T7. The processing step 234 may be performed after the time point T8. The verification step 222 may be performed after the time point T8 and after the processing step 234.

In an embodiment, the precharge voltage $V_{pre}$ may be 4V, the pulse voltage $V_a$ may be 3V, the program voltage $V_{pgm}$ may be 24V, and the pass voltage $V_{pass}$ may be 8V, the dummy voltage $V_{dmy1}$ and the dummy voltage $V_{dmy2}$ may range from 3V to 8V. The first precharge duration may be equal to the second precharge duration, for example, the first precharge duration and the second precharge duration may be 6 μs. The first precharge duration may be different from the second precharge duration, for example, the first precharge duration may be 7 μs and the second precharge duration may be 5 μs. In an embodiment, the precharge voltage $V_{pre}$ used in different precharge steps may be a constant value.

FIGS. 2A-2B shows the program method including two precharge steps and two program steps before one verification step in the program operation, however, the program method may include more precharge steps and program steps. For example, the program method may include N precharge steps and N program steps, each of the N precharge steps are performed before each of the N program steps respectively, and N is larger than 1. In an embodiment, each of the N precharge steps may include applying the precharge voltage $V_{pre}$ to the bit line BL_2 for a precharge duration, each of the N program steps may include applying the program voltage $V_{pgm}$ to the word line WL24 electrically connected to the selected memory cell (MC_241) for a program duration. The precharge duration decreases as N increases, and the program duration decreases as N increases. In an embodiment, the precharge duration and N are inversely proportional, and the program duration and N are inversely proportional. For example, when N is equal to 2, the precharge duration may be 6 μs, and the program duration may be 6 μs. When N is equal to 3, the precharge duration may be 4 μs, and the program duration may be 4 μs. When N is equal to 6, the precharge duration may be 2 μs, and the program duration may be 2 μs. The present disclosure is not limited thereto. In an embodiment, there are no verification steps preformed between N precharge steps, and/or there are no verification steps preformed between N program steps. For example, there are no verification steps preformed between the precharge step 201 and the precharge step 202, and/or there are no verification steps preformed between the program step 211 and the program step 212.

Figure 3:
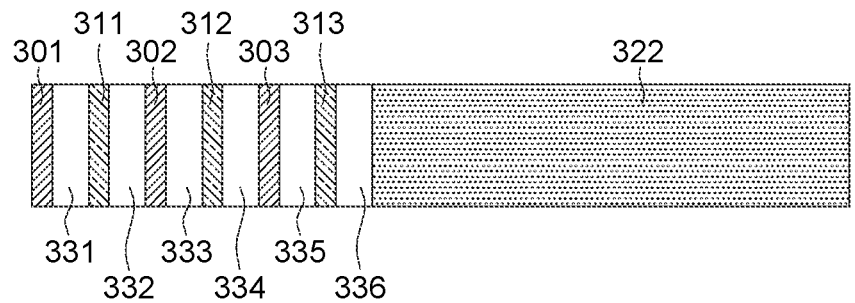
FIG. 3 illustrates a program method for the memory device according to an embodiment.

FIG. 3 illustrates a program method for the memory device according to another embodiment. The program method may include performing three precharge steps 301, 302, 303 and three program steps 311, 312, 313 before the verification step 322 in the program operation (N=3). In the program method shown in FIG. 3, the precharge step 301, the processing step 331, the program step 311, the processing step 332, the precharge step 302, the processing step 333, the program step 312, the processing step 334, the precharge step 303, the processing step 335, the program step 313, the processing step 336 and the verification step 322 may be performed in sequence. The precharge steps 301, 302, 303 may be similar to the precharge steps 201, 202 shown in FIGS. 2A-2B except the precharge duration. The program steps 311, 312, 313 may be similar to the program steps 211, 212 shown in FIGS. 2A-2B except the program duration. In an embodiment, each of the precharge steps 301, 302, 303 may be performed for a precharge duration of 4 μs, and each of the program steps 311, 312, 313 may be performed for a program duration of 4 μs.

Figure 4:
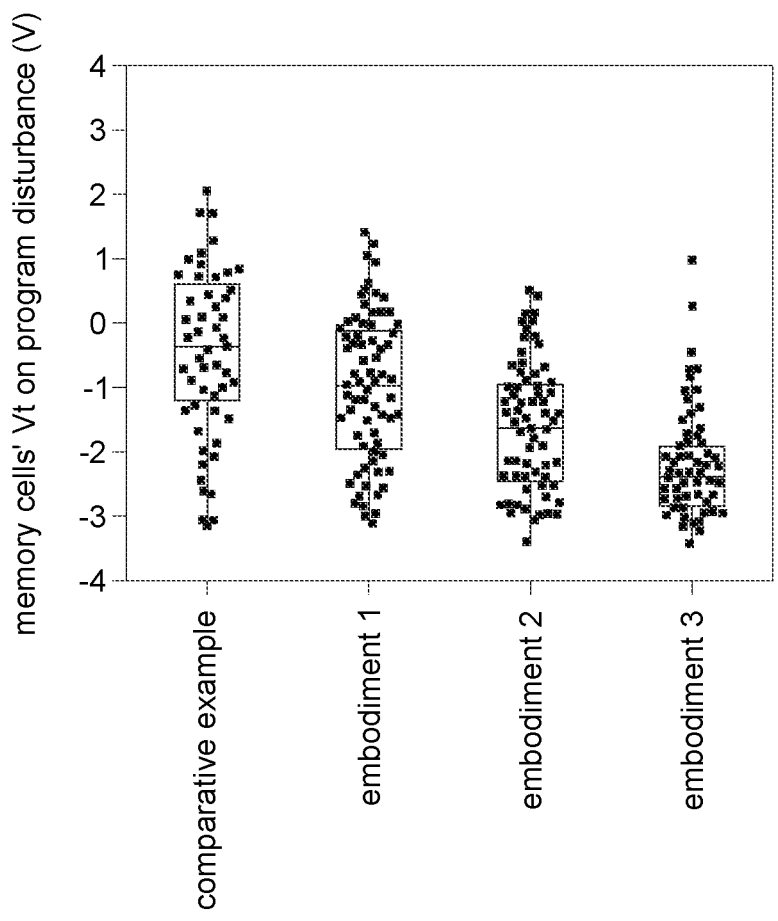
FIG. 4 illustrates testing result of the memory cells programed by a program method according to an embodiment.

FIG. 4 illustrates testing result of the memory cells programed by a program method according to an embodiment. In the comparative example, the program method merely include one precharge step in a program operation (N=1), and the precharge step is performed for a precharge duration of 12 μs. In the embodiment 1, the program method includes two precharge steps before a verification step in a program operation (N=2), and each of the precharge steps is performed for a precharge duration of 6 μs. In the embodiment 2, the program method includes three precharge steps before a verification step in a program operation (N=3), and each of the precharge steps is performed for a precharge duration of 4 μs. In the embodiment 3, the program method includes six precharge steps before a verification step in a program operation (N=6), and each of the precharge steps is performed for a precharge duration of 2 μs. As shown in FIG. 4, the inhibition of the program disturbance of embodiments 1-3 is improved as compared with the comparative example. Specifically, the inhibition of the program disturbance of embodiment 3 is superior to that of embodiment 2, and the inhibition of the program disturbance of embodiment 2 is superior to that of embodiment 1.

Figure 5:
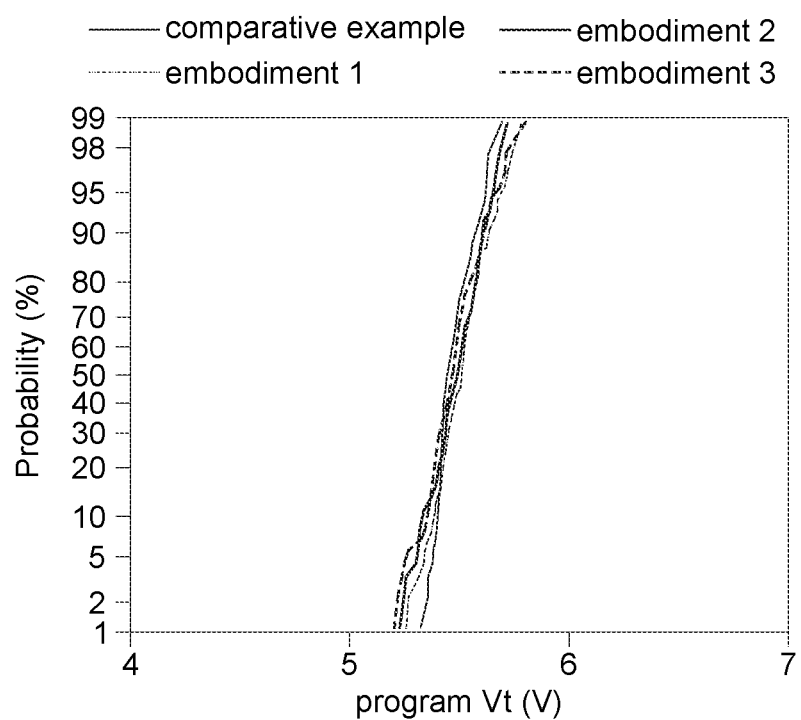
FIG. 5 illustrates testing result of the memory cells programed by a program method according to an embodiment.

FIG. 5 illustrates testing result of the memory cells programed by a program method according to the comparative example and the embodiments 1-3. As shown in FIG. 5, the program capabilities of the comparative example and the embodiments 1-3 are similar. That is to say, the program method provided by the present disclosure can improve the inhibition of the program disturbance, and maintain the program capability as well.

Figure 6:
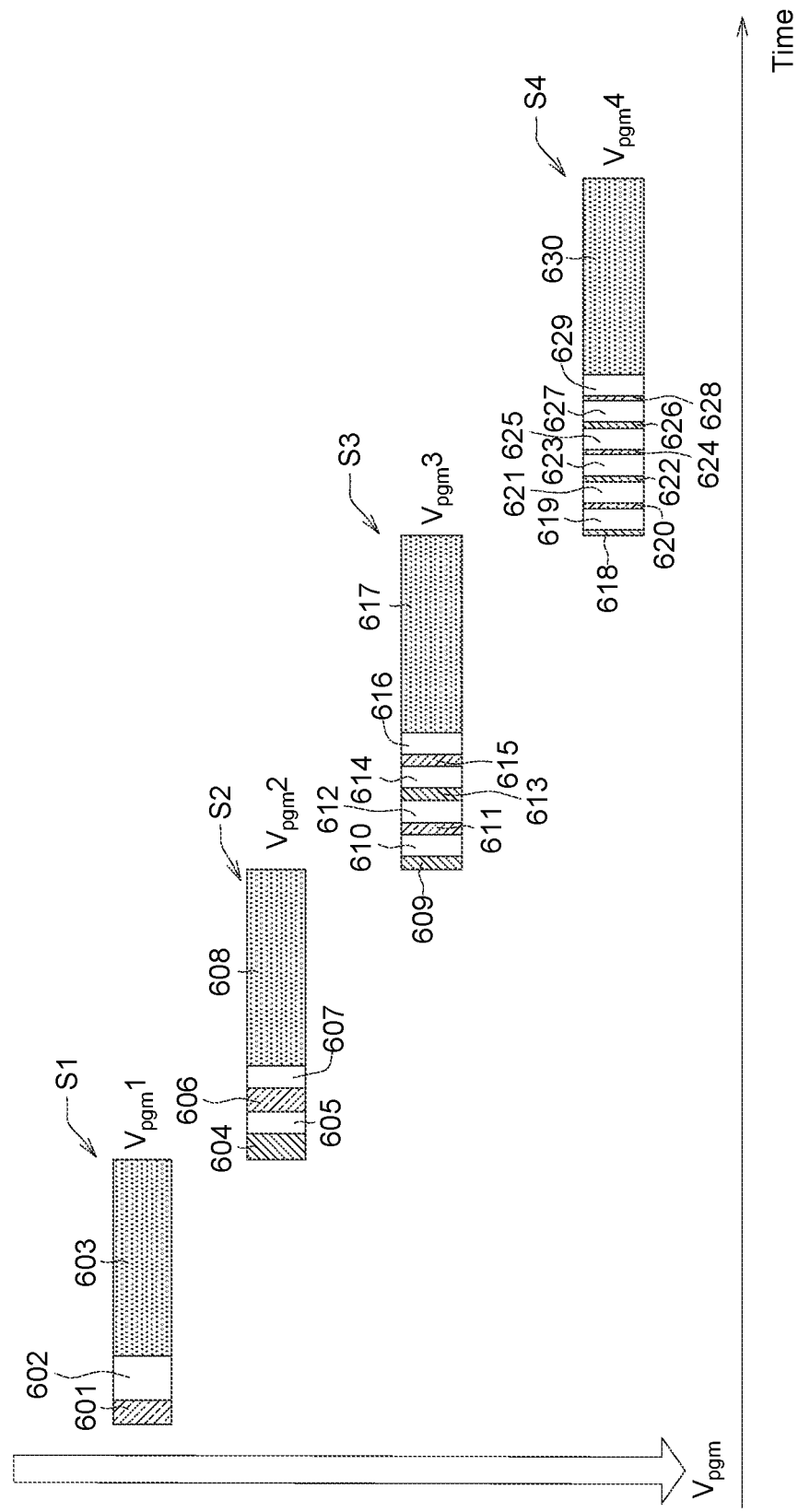
FIG. 6 illustrates a program method for the memory device according to another embodiment.

Please refer to FIG. 1 and FIG. 6 at the same time. FIG. 6 illustrates a program method for the memory device according to another embodiment. When the memory device shown in FIG. 1 is in a program operation, one of the memory cells MC is selected for programming, and the other memory cells MC can be understood as unselected memory cells. For example, the memory cell MC_241 is selected and can be understood as a selected memory cell, the other memory cells MC (i.e. memory cells MC_01, MC_11 . . . MC_231, MC_251 . . . MC_461, MC_471 and MC_02, MC_12 . . . MC_232, MC_242, MC_252 . . . MC_462, MC_472) can be understood as unselected memory cells, the first memory string 101 including the selected memory cell (MC_241) can be understood as a selected memory string, and the second memory string 102 including the unselected memory cells (MC_02, MC_12 . . . MC_232, MC_242, MC_252 . . . MC_462, MC_472) can be understood as an unselected memory string.

The program method may include applying a series of increased program voltages to program the selected memory cell (MC_241) in a program operation. In the series of the program voltages, the program voltages may be increased, but not limit to, in steps; that is, the program voltages may be increased by a constant difference. The program method may include several program stages. Each of the program stages corresponds to each of the program voltages among the series of program voltages respectively. Each of the program stages includes a verification step to the selected memory cell (MC_241), and at least one program step, including applying a corresponding program voltage to the word line WL24 electrically connected to the selected memory cell (MC_241), prior to the verification step. For illustration purposes, four program stages are illustrated in FIG. 6 as an example.

In FIG. 6, the program method includes program stages S1, S2, S3, S4 performed in sequence. Each of the program stages S1-S4 corresponds to each of program voltages $V_{pgm}1$, $V_{pgm}2$, $V_{pgm}3$, $V_{pgm}4$ respectively. In this embodiment, the program voltages may be increased in steps of x volts (x is larger than 0), that is, the program voltage $V_{pgm}2$ may be understood as $V_{pgm}1+x$, the program voltage $V_{pgm}3$ may be understood as $V_{pgm}1+2x$, the program voltage $V_{pgm}4$ may be understood as $V_{pgm}1+3x$.

The program stage S1 includes performing a program step 601 and performing a verification step 603 after the program step 601. The program stage S1 may further include a processing step 602 performed between the program step 601 and the verification step 603. The program step 601 includes applying the program voltage $V_{pgm}1$ to the word line WL24 electrically connected to the selected memory cell (MC_241) so as to program the selected memory cell (MC_241). The verification step 603 is performed to the selected memory cell (MC_241) so as to verify whether the selected memory cell (MC_241) is programmed properly.

If the verification step 603 of the program stage S1 fails (which means the selected memory is not programmed successfully), the program stage S2 may hereafter be performed, with the increased program voltage $V_{pgm}2$ and a precharge step. The program stage S2 may include performing a precharge step 604, a processing step 605, a program step 606, a processing step 607, and a verification step 608 in sequence. The precharge step 604 may include applying a precharge voltage $V_{pre}$ to the bit line BL_2 electrically connected to the unselected memory cells (MC_02, MC_12 . . . MC_232, MC_242, MC_252 . . . MC_462, MC_472) of the second memory string 102 so as to turn off the unselected memory cells (MC_02, MC_12 . . . MC_232, MC_242, MC_252 . . . MC_462, MC_472) of the second memory string 102 and inhibit programming of the unselected memory cells (MC_02, MC_12 . . . MC_232, MC_242, MC_252 . . . MC_462, MC_472) of the second memory string 102. The program step 606 may include applying the program voltage $V_{pgm}2$ to the word line WL24 so as to program the selected memory cell (MC_241). The verification step 608 is performed to the selected memory cell (MC_241) so as to verify whether the selected memory cell (MC_241) is programmed properly.

If the verification step 608 of the program stage S2 fails (which means the selected memory is not programmed successfully), the program stage S3 may hereafter be performed, with the increased program voltage $V_{pgm}3$ and more precharge steps (as compared with the program stage S2). The program stage S3 may include performing a precharge step 609, a processing step 610, a program step 611, a processing step 612, a precharge step 613, a processing step 614, a program step 615, a processing step 616, and a verification step 617 in sequence. The precharge step 609 may include applying the precharge voltage $V_{pre}$ to the bit line BL_2. The program step 611 may include applying the program voltage $V_{pgm}3$ to the word line WL24. The precharge step 613 may similar to the precharge step 609. The program step 615 may similar to the program step 611. The verification step 617 is performed to the selected memory cell (MC_241) so as to verify whether the selected memory cell (MC_241) is programmed properly. The program stage S3 may be similar to the operation shown in above FIGS. 2A-2B.

If the verification step 617 of the program stage S3 fails (which means the selected memory is not programmed successfully), the program stage S4 may hereafter be performed, with the increased program voltage $V_{pgm}4$ and more precharge steps (as compared with the program stage S3). The program stage S4 may include performing a precharge step 618, a processing step 619, a program step 620, a processing step 621, a precharge step 622, a processing step 623, a program step 624, a processing step 625, a precharge step 626, a processing step 627, a program step 628, a processing step 629, and a verification step 630 in sequence. Each of the precharge steps 618, 622, 626 may include applying the precharge voltage VP, to the bit line BL_2. Each of the program steps 620, 624, 628 may include applying the program voltage $V_{pgm}4$ to the word line WL24. The verification step 630 is performed to the selected memory cell (MC_241) so as to verify whether the selected memory cell (MC_241) is programmed properly. The program stage S4 may be similar to the operation shown in above FIG. 3.

In FIG. 6, the program method includes four program stages, however, the program method may include more than or less than four program stages. In an embodiment, the program method may include more program stages performed after the program stage S4, with the increased program voltages. The program voltages $V_{pgm}$ may be incrementally increased in above manner until the selected memory cell (MC_241) is programmed properly, or until a desired threshold voltage of the selected memory cell (MC_241) is reached. In an embodiment, in one program stage, there are no verification steps preformed between precharge steps, and/or there are no verification steps preformed between program steps. In another embodiment, one program stage includes only one verification step performed after all of the program step(s) of that program stage is finished.

In FIG. 6, the precharge step 604 may include applying the precharge voltage $V_{pre}$ to the bit line BL_2 for a first precharge duration, each of the precharge steps 609, 613 may include applying the precharge voltage $V_{pre}$ to the bit line BL_2 for a second precharge duration, and each of the precharge steps 618, 622, 626 may include applying the precharge voltage $V_{pre}$ to the bit line BL_2 for a third precharge duration. The first precharge duration may be larger than the second precharge duration, and the second precharge duration may be larger than the third precharge duration. In an embodiment, the first precharge duration may be 12 μs, the second precharge duration may be 6 μs, and the third precharge duration may be 4 μs. In an embodiment, in a program stage, the precharge duration of depends on a number of the precharge steps. Specifically, the precharge duration decreases as the number of the precharge steps increases. In an embodiment, the precharge voltage $V_{pre}$ used in different program stages may be a constant value.

In FIG. 6, the program step 606 may include applying the program voltage $V_{pgm}2$ to the word line WL24 for a first program duration, each of the program steps 611, 615 may include applying the program voltage $V_{pgm}3$ to the word line WL24 for a second program duration, and each of the program steps 620, 624, 628 may include applying the program voltage $V_{pgm}4$ to the word line WL24 for a third program duration. The first program duration may be larger than the second program duration, and the second program duration may be larger than the third program duration. In an embodiment, the first program duration may be 12 μs, the second program duration may be 6 μs, and the third program duration may be 4 μs. In an embodiment, in a program stage, the program duration of depends on a number of the program steps. Specifically, the program duration decreases as the number of the program steps increases.

The program disturbance may be slight when the program voltage is low. As such, the precharge step may be unnecessary when the program voltage is low. For example, in FIG. 6, the program stage S1 does not include the precharge step since the program voltage $V_{pgm}1$ is low.

In an embodiment, as the program voltage $V_{pgm}$ increases, the number of the program steps in each of the program stage may increase and the program duration in each of the program stage may decrease. In an embodiment, as the program voltage $V_{pgm}$ increases, the number of the precharge steps in each of the program stage may increase and the precharge duration in each of the program stage may decrease. The number of the precharge steps may be equal to number of the program steps.

Figure 7:
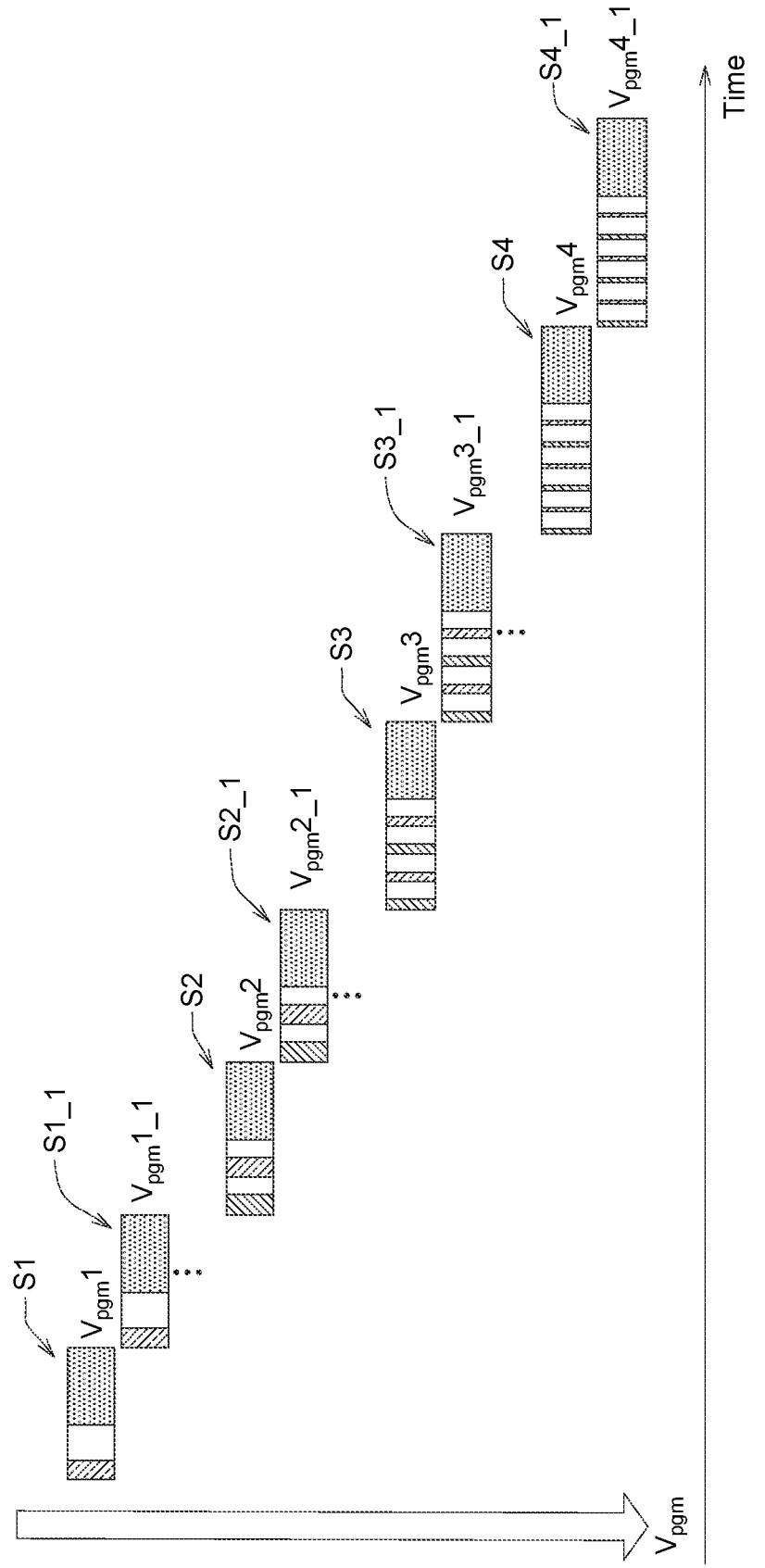
FIG. 7 illustrates a program method for the memory device according to another embodiment.

FIG. 7 illustrates a program method for the memory device according to another embodiment. The difference between the program method shown in FIG. 7 and the program method shown in FIG. 6 is that the program method shown in FIG. 7 may include more program stages between the program stages S1, S2, S3, S4. For example, the program method shown in FIG. 7 may include program stage S1_1 between the program stage S1 and the program stage S2. The program stage S1_1 is similar to the program stage S1 except for the program voltage $V_{pgm}1\_1$ used in the program stage S1_1. The program voltage $V_{pgm}1\_1$ is larger than the program voltage $V_{pgm}1$ used in the program stage S1, and less than the program voltage $V_{pgm}2$ used in the program stage S2. The program method may include a program stage S2_1 between the program stage S2 and the program stage S3. The program stage S2_1 is similar to the program stage S2 except for the program voltage $V_{pgm}2\_1$ used in the program stage S2_1. The program voltage $V_{pgm}2\_1$ is larger than the program voltage $V_{pgm}2$ used in the program stage S2, and less than the program voltage $V_{pgm}3$ used in the program stage S3. The program method may include a program stage S3_1 between the program stage S3 and the program stage S4. The program stage S3_1 is similar to the program stage S3 except for the program voltage $V_{pgm}3\_1$ used in the program stage S3_1. The program voltage $V_{pgm}3\_1$ is larger than the program voltage $V_{pgm}3$ used in the program stage S3, and less than the program voltage $V_{pgm}4$ used in the program stage S4. The program method may include a program stage S4_1 after the program stage S4. The program stage S4_1 is similar to the program stage S4 except for the program voltage $V_{pgm}4\_1$ used in the program stage S4_1. The program voltage $V_{pgm}4\_1$ is larger than the program voltage $V_{pgm}4$ used in the program stage S4.

In an embodiment, the program method may include more than one program stages between the program stage S1 and the program stage S2, and/or between the program stage S2 and the program stage S3, and/or between the program stage S3 and the program stage S4, and/or after the program stage S4. The program voltages $V_{pgm}$ used in the program stages increase every program stage.

In this embodiment, the number of the precharge steps in each of the program stages may correspond to a range of the program voltages $V_{pgm}$, that is, the number of the precharge steps in one program stage may be a constant value when the program voltages $V_{pgm}$ used in that program stage fall into the range of the program voltages $V_{pgm}$. In other words, the number of the precharge steps in one program stage increases when the program voltage $V_{pgm}$ used in that program stage increases to a specific voltage value. For example, as shown in FIG. 7, the number of the precharge steps in each of the program stages S1, S1_1 . . . is maintained at 0 before the program voltage $V_{pgm}2$ is reached; the number of the precharge steps in the program stage S2 is increased to 1 when the program voltage $V_{pgm}2$ is reached. For example, as shown in FIG. 7, the number of the precharge steps in each of the program stages S2, S2_1 . . . is maintained at 1 before the program voltage $V_{pgm}3$ is reached; the number of the program steps in the program stage S3 is increased to 2 when the program voltage $V_{pgm}3$ is reached.

In this embodiment, the number of the program steps in each of the program stages may correspond to a range of the program voltages $V_{pgm}$, that is, the number of the program steps in one program stage may be a constant value when the program voltages $V_{pgm}$ used in that program stage fall into the range of the program voltages $V_{pgm}$. In other words, the number of the program steps in one program stage increases when the program voltage $V_{pgm}$ used in that program stage increases to a specific voltage value. For example, as shown in FIG. 7, the number of the program steps in each of the program stages S2, S2_1 . . . is maintained at 1 before the program voltage $V_{pgm}3$ is reached; the number of the program steps in the program stage S3 is increased to 2 when the program voltage $V_{pgm}3$ is reached. The number of the precharge steps may be equal to number of the program steps.

In a comparative example of program method including merely one precharge step and one program step, a local self-boosting occurring in the channel of the unselected memory cells in the unselected memory string may collapse during the program step, since a potential difference between the unselected memory cells may induce a band to band leakage. Besides, the collapse of the local self-boosting is getting worse as the program duration of the program step is increased. The collapse of the local self-boosting may decrease control gate-to-channel potential differences of the unselected memory cells, and thus result in a serious program disturbance. In contrast, the present disclosure provides program methods including more than one precharge step, performing more than one precharge step in a program operation is beneficial to establish a stable local self-boosting and can reduce or avoid the collapse of the local self-boosting, and thus the program disturbance can be reduced or inhibited. Moreover, as compared with the comparative example of program method including merely one precharge step and one program step, the precharge step of the program methods provided by the present disclosure is performed with a short precharge duration, and the program step of the program methods provided by the present disclosure is performed with a short program duration. An increased number of the precharge steps with a short precharge duration for each of the precharge steps in a program operation are beneficial to establish a local self-boosting efficiently and make the unselected memory cells in a strong off condition. Short program duration is also beneficial to establish a local self-boosting and can reduce or avoid the collapse of the local self-boosting, and thus the program disturbance can be reduced or inhibited. Therefore, the inhibition of the program disturbance for a memory device and the program window can be improved by the present disclosure, while the program capability of the memory device is maintain.

Embodiments may extend to other variations according to the concepts according to the present disclosure.

For example, the memory string may be a vertical channel structure, or may use a single gate vertical channel structure, a vertical gate structure or the like. The memory cells may be floating gate memory cells, nitride-trapping memory cells or the like. The memory cells may be single-level cells, multi-level cells, triple-level cells or the like.

While the disclosure has been described by way of example and in terms of the exemplary embodiment(s), it is to be understood that the disclosure is not limited thereto. On the contrary, it is intended to cover various modifications and similar arrangements and procedures, and the scope of the appended claims therefore should be accorded the broadest interpretation so as to encompass all such modifications and similar arrangements and procedures.

What is claimed is:

1. A program method for a memory device, the memory device comprising a plurality of memory cells, a bit line and word lines electrically connected to the plurality of memory cells, the plurality of memory cells comprising a selected memory cell and unselected memory cells when the memory device in a program operation, the program method comprising:
performing precharge steps, each of the precharge steps comprises applying a precharge voltage to the bit line electrically connected to the unselected memory cells;
performing program steps, each of the program steps comprises applying a program voltage to a word line of the word lines electrically connected to the selected memory cell; and
performing a verification step to the selected memory cell after the precharge steps and the program steps.

2. The program method according to claim 1, wherein the precharge steps comprise a first precharge step and a second precharge step performed after the first precharge step, the program steps comprise a first program step and a second program step performed after the first program step, the first program step is performed between the first precharge step and the second precharge step.

3. The program method according to claim 2, wherein the second program step is performed between the second precharge step and the verification step.

4. The program method according to claim 2, wherein the first precharge step comprises applying the precharge voltage to the bit line for a first precharge duration, the second precharge step comprises applying the precharge voltage to the bit line for a second precharge duration, the first precharge duration is different from the second precharge duration.

5. The program method according to claim 2, wherein the first precharge step comprises applying the precharge voltage to the bit line for a first precharge duration, the second precharge step comprises applying the precharge voltage to the bit line for a second precharge duration, the first precharge duration is equal to the second precharge duration.

6. The program method according to claim 1, wherein the program method comprises N precharge steps, each of the N precharge steps comprises applying the precharge voltage to the bit line for a precharge duration, the precharge duration decreases as N increases.

7. The program method according to claim 6, wherein the precharge duration and N are inversely proportional.

8. The program method according to claim 6, wherein the program method comprises N program steps, each of the N program steps comprises applying the program voltage to the word line for a program duration, the program duration decreases as N increases.

9. The program method according to claim 1, wherein the memory device comprises a first memory string and a second memory string, the first memory string comprises the selected memory cell, the second memory string comprises the unselected memory cells, the first memory string is different from the second memory string and adjacent to the second memory string.

10. The program method according to claim 9, wherein each of the precharge steps comprises applying a pulse voltage to a string selection line electrically connected between the second memory string and the bit line so as to connect the second memory string with the bit line.

11. A program method for a memory device, the memory device comprising a plurality of memory cells, a bit line and word lines electrically connected to the plurality of memory cells, the plurality of memory cells comprising a selected memory cell and unselected memory cells when the memory device in a program operation, the program method comprising:
performing a first precharge step, the first precharge step comprises applying a precharge voltage to the bit line electrically connected to the unselected memory cells;
performing a first program step, the first program step comprises applying a first program voltage to a word line of the word lines electrically connected to the selected memory cell;
performing second precharge steps, each of the second precharge steps comprises applying the precharge voltage to the bit line electrically connected to the unselected memory cells, and
performing second program steps, each of the second program steps comprises applying a second program voltage to the word line of the word lines electrically connected to the selected memory cell,
wherein the second program voltage is different from the first program voltage.

12. The program method according to claim 11, wherein the first program step is performed before the second program steps, the first program voltage is less than the second program voltage.

13. The program method according to claim 12, wherein the first program step comprises applying the first program voltage to the word line for a first program duration, each of the second program steps comprises applying the second program voltage to the word line for a second program duration, the first program duration is larger than the second program duration.

14. The program method according to claim 11, wherein the first precharge step is performed before the second precharge steps.

15. The program method according to claim 14, wherein the first precharge step comprises applying the precharge voltage to the bit line for a first precharge duration, each of the second precharge steps comprises applying the precharge voltage to the bit line for a second precharge duration, the first precharge duration is larger than the second precharge duration.

16. The program method according to claim 11, wherein each of the second precharge steps is performed before each of the second program steps respectively.

17. The program method according to claim 11, wherein the program method further comprises performing a first verification step to the selected memory cell after the first precharge step and the first program step.

18. The program method according to claim 17, wherein the second precharge steps and the second program steps are performed if the first verification step fails.

19. The program method according to claim 17, wherein the program method further comprises performing a second verification step to the selected memory cell after the second precharge steps and the second program steps, wherein the first precharge step, the first program step and the first verification step are performed before the second precharge steps, the second program steps and the second verification step.

20. The program method according to claim 11, wherein the program method further comprises:
performing a plurality of the first precharge steps, each of the plurality of the first precharge steps comprises applying the precharge voltage to the bit line electrically connected to the unselected memory cells, and
performing a plurality of the first program steps, each of the plurality of the first program steps comprises applying the first program voltage to the word line of the word lines electrically connected to the selected memory cell,
wherein the plurality of the first precharge steps and the plurality of the first program steps are performed before the second precharge steps and the second program steps, a number of the plurality of the first precharge steps is less than a number of the second precharge steps.

* * * * *